United States Patent [19]
Furusho et al.

[11] Patent Number: 5,581,510
[45] Date of Patent: Dec. 3, 1996

[54] METHOD OF TESTING FLASH MEMORY

[75] Inventors: Tatsuki Furusho; Tomohisa Iba, both of Hyogo, Japan

[73] Assignees: Mitsubishi Denki Kabushiki Kaisha, Tokyo; Mitsubishi Electric Semiconductor Software Corporation, Hyogo, both of Japan

[21] Appl. No.: 463,804

[22] Filed: Jun. 5, 1995

[30] Foreign Application Priority Data

Jun. 28, 1994 [JP] Japan .................................. 6-146478

[51] Int. Cl.⁶ ........................... G11C 7/00; G11C 11/34; G11C 29/00; G01R 31/26
[52] U.S. Cl. .................... 365/201; 365/218; 365/185.33; 371/21.3; 437/8
[58] Field of Search .................................. 365/201, 218, 365/185.33; 371/21.3; 437/8

[56] References Cited

U.S. PATENT DOCUMENTS

| | | | |
|---|---|---|---|
| 4,578,751 | 3/1986 | Erwin | 365/218 |
| 5,399,505 | 3/1995 | Dasse et al. | 437/8 |

Primary Examiner—David C. Nelms
Assistant Examiner—Trong Phan
Attorney, Agent, or Firm—Lowe, Price, LeBlanc & Becker

[57] ABSTRACT

According to a time required for programing operation, respective chips of flash memories are divided into a first group and a second group of chips requiring a time longer than the first group for the programing operation, and a postburn-in test, a high temperature test, and a low temperature test are carried out to a plurality of chips belonging to the first group simultaneously, and to a plurality of chips belonging to the second group simultaneously.

9 Claims, 13 Drawing Sheets

METHOD OF TESTING FLASH MEMORY

BACKGROUND OF THE INVENTION

1. Field of the Invention

The present invention relates to a method of testing a flash memory, and more particularly, to a method of testing an electrically programmable (writable) and entirely erasable flash memory.

2. Description of the Background Art

Today, there is a memory such as an electrically programmable and entirely erasable flash memory among non-volatile semiconductor memories in which stored data continues to be held even if a power supply is not applied.

FIG. 8 shows a sectional view of a one-bit memory cell of a conventional flash memory. A 1M-bit flash memory, for example, includes 1M memory cells each having this configuration. Referring to FIG. 8, a drain region 2 of an n type diffusion region is formed in a p type semiconductor substrate 1, and a source region 3 of an n type diffusion region is spaced apart from drain region 2 in semiconductor substrate 1. A floating gate 4 is formed on a channel region in semiconductor substrate 1 sandwiched by drain region 2 and source region 3 with a gate insulating film 5 interposed therebetween. A control gate 6 is formed on floating gate 4 with an insulating film 7 interposed therebetween.

Description will now be given of programming operation (only writing operation) of a memory cell of a flash memory shown in FIG. 8. 8 V, 12 V, and 0 V are applied to drain region 2, control gate 6, and source region 3 of the memory cell, so that channel is generated in the channel region. Hot electrons in the channel region are injected into floating gate 4, programming is carried out, and "0" is stored in the memory cell.

Description will now be given of erasing operation. Drain region 2 is made open (a state where no potential is applied), and 0 V and 12 V are applied to control gate 6 and source region 3, respectively, so that electrons are extracted from floating gate 4 to source region 3. Erasing (FN (Fowler-Nordheim)tunnel erasure) is carried out, and "1" is stored in the memory cell. The erasing operation is performed to all the memory cells at a time.

Reading operation will now be described. 5 V, 0 V, and approximately 1 V are applied to control gate 6, source region 3, and drain region 2 of a memory cell selected in response to an address signal. When electrons are injected into floating gate 4, that is, when "0" is stored in the memory cell, the threshold voltage of the memory cell is high, and higher than 5 V. Therefore, the region between drain region 2 and source region 3 of the memory cell is rendered non-conductive, causing no current flow. When electrons are extracted from floating gate 4, that is, when "1" is stored in the memory cell, the threshold voltage of the memory cell is lower than 5 V. Therefore, the region between drain region 2 and source region 3 of the memory cell is rendered conductive, causing a current flow. A sense amplifier, not shown, determines whether or not there is a current flow between drain region 2 and source region 3, and provides a potential at the level corresponding to "0" or "1".

FIG. 9 is a diagram showing a circuit configuration of part of a memory cell array in which a plurality of memory cells each having the configuration shown in FIG. 8 are arranged. Referring to FIG. 9, word lines WLi (i=0, 1, . . . ) are arranged corresponding to each row, and bit lines BLj (j=0, 1, . . . ) are arranged corresponding to each column. Memory cells MCij are provided corresponding to respective crossing points of word lines WLi and bit lines BLj, with their drains connected to corresponding bit lines BLj, and their control gates connected to corresponding word lines WLi (actually, word lines WLi partly serve as control gates). A source line SL is connected to the sources of respective memory cells MCij in common.

During programming operation, 12 V is applied to one of word lines WLi selected in response to an address signal, 8 V is applied to one of bit lines BLj selected in response to the address signal, and 0 V is applied to source line SL, so that programming is carried out to one of memory cells MCij selected in response to the address signal. During entire erasing operation, 0 V and 12 V are applied to each of word lines WLi and source line SL, and each of bit lines BLj is made open, so that erasing of each of memory cells MCij is carried out. Further, during reading operation, 5 V is applied to one of word lines WLi selected in response to an address signal, approximately 1 V is applied to one of bit lines BLj selected in response to the address signal, 0 V is applied to source line SL, and the selected bit line is connected to a sense amplifier (not shown), so that data stored in one of memory cells MCij selected in response to the address signal is provided.

In the flash memory shown in FIG. 9, when "0" is stored in memory cell MC00 (that is, when electrons are injected into the floating gate of memory cell MC00, and the threshold voltage is higher than 5 V), memory cell MC00 is selected in response to an address signal, 5 V, 1 V, and 0 V are applied to word line WL0, bit line BL0, and source line SL in order to read out data stored in memory cell MC00, and bit line BL0 and a sense amplifier are connected, for example, the sense amplifier detects memory cell MC00 being rendered non-conductive, and there being no current flow from bit line BL0 to source line SL, and provides a potential at the level indicating that "0" is stored in memory cell MC00. However, if too many electrons of the floating gate of non-selected memory cell MC10 are extracted, and the threshold voltage of memory cell MC10 is 0 V or less (if memory cell MC10 is overerased), memory cell MC10 is rendered conductive even if the potential of word line WL1 is 0 V indicating non-selection, there is a current flow from bit line BL0 to source line SL through memory cell MC10, the sense amplifier connected to bit line BL0 senses the current, and erroneously provides a potential at the level indicating that "1" is stored in memory cell MC00.

In order to prevent this erroneous operation, programing-before-erasing operation is carried out before entire erasing in which electrons are simultaneously extracted from the floating gates of all memory cells MCij. More specifically, electrons are injected into the floating gates of all memory cells MCij ("0" is stored in all memory cells MCij), and then electrons are simultaneously extracted from the floating gates of all memory cells MCij, to carry out entire erasing. As a result, further electrons are not extracted from a memory cell into which electrons have not been injected at its floating gate (which has stored "1"), and overerasing is prevented.

Consider the case where there is too big a difference in the electron amount injected into the floating gate between memory cells (where there is too big a difference in the threshold voltage between memory cells) when the programming-before-erasing operation is complete. In this case, around the time when electrons are completely extracted from a memory cell to which the most electrons are injected at its floating gate (which has the highest threshold voltage), electrons of a memory cell to which the least electrons are injected (which has the lowest threshold voltage) are over-extracted (the threshold voltage is lower than 0 V). Therefore, too many electrons must be injected into the floating gate at the time of programming (normal programming and programming-before-erasing), so that the threshold voltage after programing is in the range from 6 V to 8 V.

In order to implement this, electrons are not injected at a time to the floating gate at the time of programming. 12 V to be applied to word line WLi and 8 V to be applied to bit line BLj are applied in a form of a pulse having a period of approximately 10 μsec. Electrons are gradually injected into the floating gate, and program verification is carried out whenever one pulse is applied. More specifically, it is determined whether or not the threshold voltage is within the range of 6 V to 8 V whenever one pulse is applied. If the threshold voltage is within this range, application of the next pulse to word line WLi and bit line BLj is stopped, and programming operation is completed. Otherwise, the next pulse is applied to word line WLi and bit line BLj, electrons are injected into the floating gate, and program verification is again carried out.

Further, if electrons are extracted from the floating gate at a time, there is a possibility that electrons might be over-extracted (the threshold voltage might be lower than 0 V). Therefore, during entire erasing operation, 12 V to be applied to source line SL is applied in a form of a pulse having a period of approximately 9.5 msec, and electrons are gradually extracted from the floating gate to source line SL. Erase verification is carried out whenever one pulse is applied. More specifically, it is determined whether or not the threshold voltage is within the range of 2 V to 4 V whenever one pulse is applied. If the threshold voltage is within the range, application of the next pulse to source line SL is stopped, and erasing operation is completed. If the threshold voltage is not within the range of 2 V to 4 V, the next pulse is applied to source line SL, electrons are extracted from the floating gate, and erase verification is carried out again.

As described above, program verification during the programming operation or erase verification during the erasing operation causes time required for the programming operation or the erasing operation to increase in the flash memory. Due to variation in the manufacturing process or the like, time required for programming varies from application of one pulse to application of 25 pulses. As to time required for erasing, some requires application of only ten pulses, and some requires application of as many as 100 pulses.

Description will now be given of auto-programming operation of the flash memory based on the timing diagram of FIG. 10. Referring to FIG. 10, a memory cell is selected in response to an address signal ADD applied from the outside of the chip of the flash memory. When a chip enable signal /CE (/ indicates inversion of a signal in the specification and drawings) applied from the outside of the chip is at a logical high or H level, the chip is brought to a stand-by state, and does not carry out operation such as reading operation. When chip enable signal /CE attains a logical low or L level, chip enable signal /CE is brought to an active state, and carries out operation such as reading operation according to other external signals. When an externally applied output enable signal /OE is at the H level, data stored in the selected memory cell is not provided to a data input/output pin from the interior of the chip, and the output attains a high impedance state. When output enable signal /OE is at the L level, data stored in the selected memory cell is provided to the data input/output pin from the interior of the chip.

When a write enable signal /WE applied from the outside of the chip rises from the L level to the H level, data applied to the data input/output pin is loaded in the chip. Data D0–D7 shows data applied to respective input/output pins or data provided to respective input/output pins from the chip. Input/output of data is carried out with one byte (8 bits) as one unit. Externally applied power supply potential Vcc is 5 V at the time of normal operation. Externally applied power supply potential Vpp is higher than power supply potential Vcc, and is 12 V at the time of normal operation.

As shown at (f) of FIG. 10, when power supply potential Vcc is raised to 5 V at a time t0, power supply potential Vpp rises to 12 V at a time t1 in reception of power supply potential Vcc, as shown at (g) of FIG. 10. When chip enable signal /CE falls to the L level at a time t2 as shown at (b) of FIG. 10, the chip enters the active state from the stand-by state. Since output enable signal /OE and write enable signal /WE both attain the H level at the time as shown at (c) and (d) of FIG. 10, data D0–D7 is in the high impedance state as shown at (e) of FIG. 10.

Write enable signal /WE is pulled down to the L level at a time t3 as shown at (d) of FIG. 10, data D0–D7 is externally applied to an input/output pin as a command instructing execution of auto-programming as shown at (e) of FIG. 10 (10 H indicates 10 in hexadecimal digit, which is denoted as 0, 0, 0, 1, 0, 0, 0, 0 in binary digit by D7, D6, . . . , D0), and write enable signal /WE rises to the H level at a time t4 as shown at (d) of FIG. 10, so that data D0–D7 applied to the input/output pin is loaded in the chip in response to the rising. Receiving the command 10H, the chip recognizes that auto-programming operation is required.

After input of the command, chip enable signal /CE rises to the H level at a time t5 as shown at (b) of FIG. 10, address signal ADD indicating an address of a memory cell to be programmed is applied as shown at (a) of FIG. 10, and chip enable signal /CE again falls to the L level at a time t6 as shown at (b) of FIG. 10. Accordingly, address signal ADD is strobed in the chip. Then, write enable signal /WE falls to the L level at a time t7 as shown at (d) of FIG. 10, D0–D7 is applied as write data as shown at (e) of FIG. 10, and write enable signal /WE rises to the H level at a time t8 as shown at (d) of FIG. 10. Accordingly, write data D0–D7 is loaded in the chip, and programing of the eight-bit memory cell selected in response to address signal ADD using pulse application and program verification is automatically carried out in the chip according to the write data.

In order to confirm that the auto-programing operation is complete, chip enable signal /CE is brought to the H level at a time t9, and then again to the L level at a time t10 as shown at (b) of FIG. 10, and output enable signal /OE is brought to the L level at a time t11 as shown at (c) of FIG. 10, and data D0–D7 is provided. Then, by monitoring output data D7 which assumes the same logic as that of input data D7 when data stored in the selected memory cell matches write data D0–D7 loaded in the chip at time t8, and which assumes the opposite logic to that of input data D7 otherwise, completion of the auto-programing operation can be confirmed (data polling function). The time required for programing is t12–t8 which is from time t8 at which write enable signal /WE rises to the H level to time t12 at which output data D7 assumes the same logic level as that of applied data D7.

Description will now be given of auto-erasing operation of the flash memory based on the timing diagram of FIG. 11. Timings from a time t20 to a time t24 at which a command determined by data D0–D7 is applied are the same as the timings from t0 to t4 in the auto-programming operation shown in FIG. 10. Note that a command indicating auto-erasing is 30H (D7, D6, . . . , D0=0, 0, 1, 1, 0, 0, 0, 0), unlike the command 10H (D7, D6, . . . , D0=0, 0, 0, 1, 0, 0, 0, 0) indicating auto-programming.

After input of the command, chip enable signal /CE rises to the H level at a time t25, and then, falls to the H level at a time t26 again as shown at (b) of FIG. 11. After that, write enable signal /WE falls to the L level at a time t27 as shown at (d) of FIG. 11. Data D0–D7 as a command (the same command 30H as the case of auto-erasing) to confirm that auto-erasing may be actually carried out is applied as shown at (e) of FIG. 11. Write enable signal /WE rises to the H level at a time t28 as shown at (d) of FIG. 11. In response to this, command data D0–D7 for confirmation is loaded in the chip, and entire erasing using programming before erasing, pulse application, and erase verification is automatically carried out in the chip.

In order to confirm that the auto-erasing operation is complete, chip enable signal /CE is brought to the H level at a time t29 and again to the L level at a time t30 as shown at (b) of FIG. 11, output enable signal /OE is brought to the L level at a time t31 as shown at (c) of FIG. 11, and data D0–D7 is provided. By monitoring data D7 which attains the H level when erasing is complete in all the memory cells, and which otherwise attains the L level, completion of the auto-erasing operation can be confirmed (status polling function). The time required for erasing is t32–t28 which is from time t28 at which write enable signal /WE rises to the H level to time t32 at which data D7 rises to the H level.

Description will now be given of an algorithm of a test using the auto-programming operation and the auto-erasing operation based on the flow chart of FIG. 12. Referring to the figure, a wafer process step 10 indicates a wafer process in which a plurality of flash memory chips per one wafer are fabricated on a semiconductor wafer. A wafer test step 11 indicates a wafer test including a current test, a program test, and an erase test of each chip formed on the wafer in wafer process step 10. In the wafer test step (FIG. 13), a chip which cannot pass these tests is determined to be defective. An assembly step 12 indicates assembly including the steps of wire bonding between pads and pins of a chip determined to be non-defective in wafer test step 11, and molding the chip to a package. A final test step 13 indicates a final test including a burn-in test applying power supply potential higher than that of the normal operation, and accelerating a premature failure of the flash memory, a high temperature test carrying out programming, erasing, and reading operation under a high temperature, and a low temperature test carrying out programming, erasing, and reading operation under a low temperature. A flash memory which cannot pass the final test is determined to be defective, and a flash memory which can pass the final test is determined to be non-defective.

FIG. 13 is a flow chart of wafer test step 11 in FIG. 12. Referring to FIG. 13, a current test step 11a indicates a current test (DC test). In this step, a test is conducted in which current is caused to flow through a chip in order to determine whether or not pads formed on the chip and an internal circuit are connected normally, whether or not there is a portion short-circuited in the internal circuit, or the like, and in which the chip is determined to be defective if the current value is not within the range of normal values. In a program test step 11b indicating a program test, a test is conducted in which a memory cell is programmed using the above described auto-programming operation, programming within a defined time is checked, and the chip is determined to be defective if the memory cell is not programmed in the defined time. In an erase test step 11c (FIG. 15) indicating an erase test, a test is conducted in which a memory cell is erased using the above described auto-erasing operation, erasing within a defined time is checked, and the chip is determined to be defective if the memory cell is not erased within the defined time.

FIG. 14 is a flow chart of program test step 11b in FIG. 13. Referring to FIG. 14, a step 11ba is a step of turning on power supply potential Vcc and applying VppH to power supply potential Vpp, a step 11bb is a step of setting a comparator, in a tester testing a chip, comparing and determining whether or not data read out from the chip is equal to expected data to make such a determination only with respect to data D7 among data provided from the chip, a step 11bc is a step of setting to 0 an address to be applied to the chip from the tester, a step 11bd is a step of setting to 0 a register in the tester in which the total time required for programming operation to all the memory cells in one chip is stored, and a step 11be is a step of setting a definition value (for example, 400 μsec) to a timer in the tester. The definition value is a value which the time required for one (eight bits) programming operation should not exceed.

In a step 11bf, a command indicating auto-programming operation is applied from the tester to the chip, in a step 11bg, program data is applied to the chip from the tester, and in a step 11bh, the timer in the tester is started. Then, the value of the timer is decreased from the definition value set in step 11bd 10 μsec by 10 μsec. In a step 11bi, auto-programming operation is carried out in the chip. In a step 11bj, data polling for checking that auto-programming operation has been complete is conducted. Data D7 is checked for every 10 μsec, and if data D7 does not assume the same logic as that of applied D7, the procedure goes to a step 11bk of checking that the timer is not 0 sec. If the timer is not 0 sec, the procedure returns to step 11bi. Data polling is again carried out after 10 μsec. If data D7 assumes the same logic as that of applied D7, the procedure goes to the next step. If the timer is 0 sec in step 11bk, it indicates that programming has not been complete within a time of the definition value (400 μsec) set to the timer. Therefore, the chip is determined to be defective.

In a step 11bl, the timer of the tester is stopped. In a step 11bm, to a time stored in the register in the tester in which the total time required for programming operation of all the memory cells of one chip is stored, a time consumed in programming, that is, a time obtained by subtracting a time indicated by the timer stopped in step 11bl from the definition value set to the timer is added. A step 11bn is a step of determining whether or not a programmed address is the last address. If it is the last address, the procedure goes to the next step. Otherwise, the procedure returns to step 11be after a step 11bo of incrementing the address.

In a step 11bp, a command for setting a read mode for reading out data stored in the memory cell is applied to the chip, in a step 11bq, the comparator of the tester which was set to make a determination only with respect to data D7 in step 11bb is reset, in a step 11br, supply of power supply potential Vcc and power supply potential Vpp to the chip is stopped, and in a step 11bs, the total program time stored by the tester is provided.

FIG. 15 is a flow chart of erase test step 11c in FIG. 13. Referring to FIG. 15, in a step 11ca, power supply potential Vcc is turned on and VppH is applied to power supply potential Vpp, and in a step 11cb, a comparator, in a tester testing a chip, comparing and determining whether or not data read out from the chip is equal to expected data to make such a determination only with respect to data D7 among data provided from the flash memories. In a step 11cc, a definition value (for example, 30 sec) is set to a timer in the tester. The definition value is a value which the time required for erasing operation should not exceed.

In a step 11cd, a command indicating auto-erasing operation is applied to the chip from the tester, and in a step 11ce, a command confirming that erasing operation is to be carried out is applied to the chip from the tester. In a step 11cf, the timer in the tester is started. After that, the value of the timer decreases from the definition value set in step 11cc 10 msec by 10 msec. In a step 11cg, auto-erasing operation is carried out in the chip. A step 11ch is a step of carrying out status polling for checking that auto-erasing operation has been complete. Data D7 is checked for every 10 msec, and if the logic of data D7 is not "1", the procedure goes to a step 11ci of checking that the timer is not 0 sec. If the timer is not 0 sec, the procedure returns to step 11cg. After 10 msec, status polling is again carried out, and if the logic of data D7 is "1", the procedure goes to the next step. If the timer is 0 sec in step 11ci, it indicates that erasing operation has not been complete within a time of the definition value (30 sec) set to the timer. Therefore, the chip is determined to be defective.

In a step 11cj, the timer of the tester is stopped. step 11ck, a command for setting a read mode for reading out data stored in the memory cell is applied to the chip. In a step 11cl, the comparator of the tester which was set to make a determination only with respect to data D7 in step 11cb is reset. In a step 11cm, supply of power supply potential Vcc and power supply potential Vpp to the chip is stopped. In a step 11cn, the time required for erasing, that is, a time obtained by subtracting a value indicated by the timer from the definition value (30 sec) set to the timer is provided.

As described above, in the flash memory, due to variation in dimension in the manufacturing process or the like, there is a large variation of a time required for programming or erasing. Therefore, there is a big variation of a time required for a test including programming or erasing among respective flash memories. When there is a big variation of time required for testing as described above, a larger amount of time is wasted during testing. More specifically, in a parallel test in which a plurality of flash memories are simultaneously tested at a time by one tester in order to shorten a test time per flash memory, as in the case of the final test in FIG. 12 for example, a flash memory requiring the longest test time among flash memories tested simultaneously determines the time required for one test. For a flash memory requiring a shorter test time, a large amount of test time is wastefully consumed.

This problem will be described in detail with reference to FIG. 16. FIG. 16 shows the relationship, when four flash memories 1, 2, 3, and 4 are tested simultaneously, between test times tT1, tT2, tT3, and tT4 which respective flash memories are expected to require, and a test time tTS which is actually required. In the figure, the abscissa represents the device, and the ordinate represents the test time. As shown in the figure, the actual test time tTS is determined by test time tT2 of flash memory 2 which requires the longest test time. The next four flash memories cannot be mounted to the tester and tested until testing of flash memory 2 is complete. More specifically, for flash memories 1, 3, and 4, times tTS-tT1, tTS-tT3, and tTS-tT4 are wasted.

SUMMARY OF THE INVENTION

One object of the present invention is to obtain a method of testing a flash memory with which waste of a test time occurring in respective flash memories can be suppressed even if there is a big variation in the test time among respective flash memories.

In one aspect of the present invention, chips are divided into a first group of chips requiring a shorter time for programming operation and a second group of chips requiring a longer time for the programing operation, and a test involving the programing operation is carried out to a plurality of chips simultaneously in each group. Therefore, the test in the first group is complete earlier than the test in the second group, because the first group does not include the chips requiring a longer time for the programing operation. According to the present invention, the next plurality of chips can be tested in the first group without waiting for the test of the chips requiring a longer time for the programing operation to be complete, whereby a time to be consumed wastefully can be suppressed.

In another aspect of the present invention, chips are divided into a first group of chips requiring a shorter time for programming operation and a second group of chips requiring a longer time for the programing operation according to data stored in flag memory cells, and a second test involving the programming operation is carried out to a plurality of chips simultaneously in each group. Therefore, the second test in the first group is complete earlier than that in the second group, because the first group does not include the chips requiring a longer time for the programing operation. Therefore, according to the present invention, the next plurality of chips can be tested in the first group without waiting for the test of the chips requiring a longer time for the programing operation to be complete, whereby a time to be consumed wastefully can be suppressed. Further, by carrying out data writing (writing) to the flag memory cells for dividing chips into the first group and the second group at the time of a first test conducted before a division test step, a time to be consumed by dividing chips into the first group and the second group can be suppressed, whereby a test time to be consumed wastefully is further suppressed.

According to a further aspect of the present invention, chips are divided into a first group of chips requiring a shorter time for erasing operation and a second group of chips requiring a longer time for the erasing operation, and a test involving the erasing operation is carried out to a plurality of chips simultaneously in each group. Therefore, the test in the first group is complete earlier than that in the second group, because the first group does not include the chips requiring a longer time for the erasing operation. According to the present invention, the next plurality of chips can be tested in the first group without waiting for the test of the chips requiring a longer time for the erasing operation to be complete, whereby a time to be consumed wastefully can be suppressed.

According to a further aspect of the present invention, chips are divided into a first group of chips requiring a shorter time for erasing operation and a second group of chips requiring a longer time for the erasing operation according to data stored in flag memory cells, and a second test involving the erasing operation is carried out to a plurality of chips simultaneously in each group. Therefore, the second test in the first group is complete earlier than that in the second group, because the first group does not include the chips requiring a longer time for the erasing operation. According to the present invention, the next plurality of chips can be tested in the first group without waiting for the test of the chips requiring a longer time for the erasing operation to be complete, whereby a time to be consumed wastefully can be suppressed. Further, by carrying out data writing (writing) to the flag memory cells for dividing the chips into the first group and the second group at the time of a first test conducted before a division test step, a time to be consumed by dividing the chips into the first group and the second group can be suppressed, and a test time to be consumed wastefully is further suppressed.

According to a further aspect of the present invention, chips are divided into a first group of chips requiring a shorter time for both programming operation and erasing operation and a second group of chips requiring a longer time for the programming operation or the erasing operation, and a test involving the programming operation and the erasing operation is carried out to a plurality of chips simultaneously in each group. Therefore, the test in the first group is complete earlier than that in the second group, because the first group does not include the chips requiring a longer time for the programming operation or the erasing operation. According to the present invention, the next plurality of chips can be tested in the first group without waiting for the test of the chips requiring a longer time for the programming operation or the erasing operation to be complete, whereby a test time to be consumed wastefully can be suppressed.

According to a further aspect of the present invention, chips are divided into a first group of chips requiring a shorter time for programming operation and a shorter time for erasing operation and a second group of chips requiring a longer time for the programming operation or the erasing operation, and a second test involving the programming operation and the erasing operation is carried out to a plurality of chips simultaneously in each group. Therefore, the second test in the first group is complete earlier than that in the second group, because the first group does not include the chips requiring a longer time for the programming operation or the erasing operation. According to the present invention, the next plurality of chips can be tested in the first group without waiting for the test of the chips requiring a longer time for the programming operation or the erasing operation to be complete, whereby a time to be consumed wastefully can be suppressed. Further, by carrying out data writing (writing) to the flag memory cells for dividing the chips into the first group and the second group at the time of a first test conducted before a division test step, a time to be consumed by dividing the chips into the first group and the second group can be suppressed, whereby a test time to be consumed wastefully is further suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
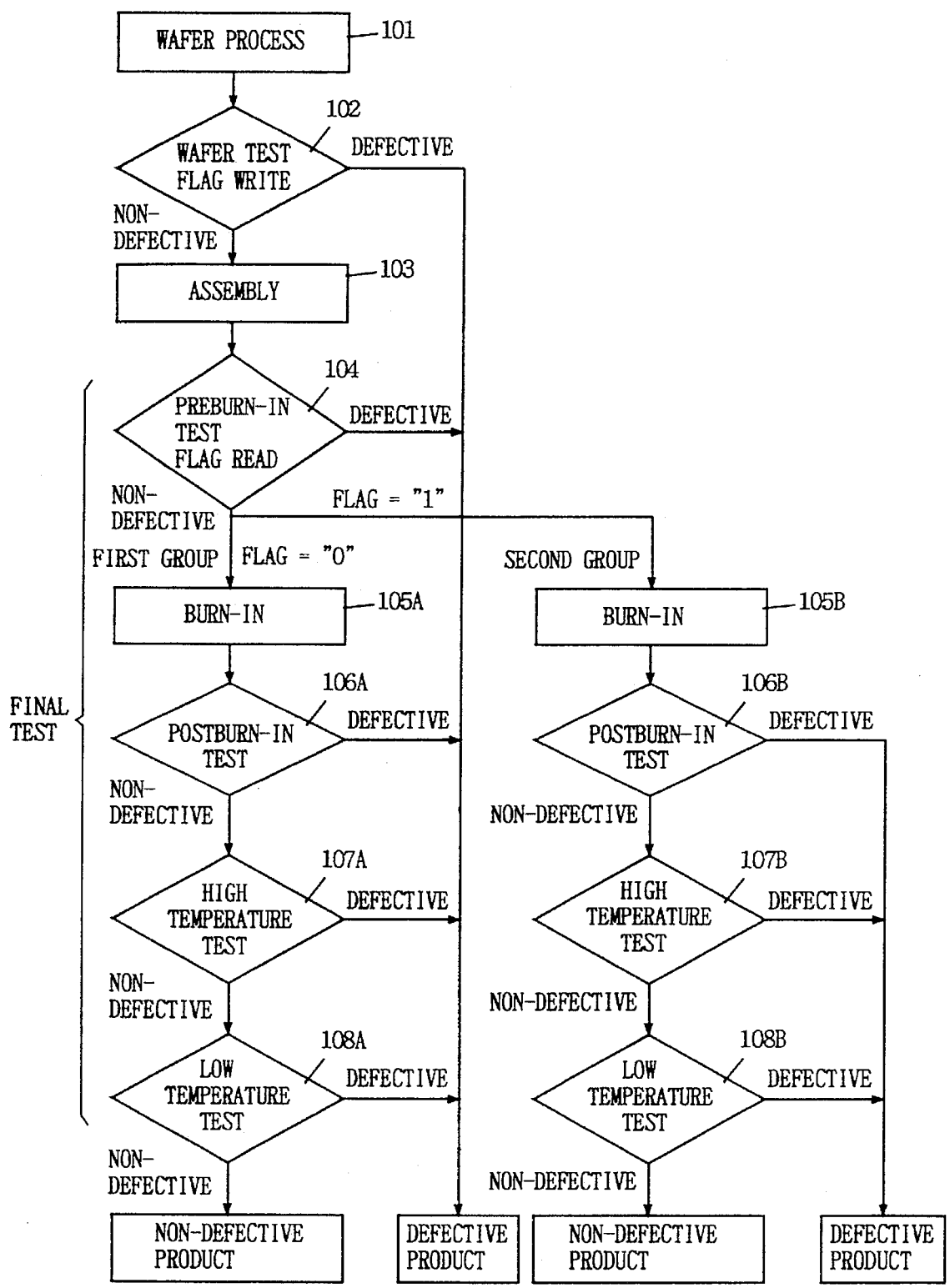
FIG. 1 is a flow chart showing an algorithm of a method of testing of Embodiment 1 of the present invention.

A method of testing a flash memory according to Embodiment 1 of the present invention will be described hereinafter with reference to flow charts of FIGS. 1 and 2. FIG. 1 is a flow chart showing an algorithm of a test using auto-programming operation and auto-erasing operation. In the figure, a wafer process step 101 indicates a wafer process in which a plurality of flash memory chips per one wafer are fabricated on a semiconductor wafer. A wafer test step 102 indicates a wafer test (FIG. 2) including a current test, a program test, and an erase test of each chip formed on the wafer in wafer process step 101. A chip which cannot pass these tests is determined to be defective. Wafer test step 102 corresponds to a flag write step in Embodiment 1 of the present invention. Further, in Embodiment 1, flag writing is also carried out, which, using a program time of each chip detected during the program test in wafer test step 102, stores "0" in flag memory cells which are formed on each chip if the program time is smaller than a group division value, and which stores "1" in the flag memory cells if the program time is equal to or larger than the group division value.

An assembly step 103 indicates assembly including the step of wire bonding between pads and pins of a chip determined to be non-defective in wafer test step 102, and the step of molding the chip to a package. A preburn-in test step 104 is a test step including a preburn-in test of whether or not each flash memory normally operating at a room temperature (around 27° C.). In this step, defectiveness such as disconnection generated in the assembly step, and holding characteristics of a memory cell such as a degree of electrons not coming off from the floating gate are examined. Further, in Embodiment 1, reading operation for reading out data stored in the memory cells is carried out in the preburn-in test. Therefore, data stored in flag memory cells is also read out. If data stored in the flag memory cells is "0", the flash memory is classified into a first group. If data stored in the flag memory cells is "1", the flash memory is classified into a second group. In Embodiment 1, a design value of a program time of a flash memory is set lower than a group division value. Therefore, most flash memories are classified into the first group.

Burn-in steps 105A and 105B (in which A indicates the first group, and B indicates the second group) include burn-in accelerating a premature failure of a flash memory by applying high power supply potential to carry out reading operation. Postburn-in test steps 106A and 106B are steps of testing a failure not being generated by burn-in. The postburn-in test involves programming operation, erasing operation, and reading operation. High temperature test steps 107A and 107B include a high temperature test carrying out programming operation, erasing operation, and reading operation under a high temperature. Low temperature test steps 108A and 108B include a low temperature test carrying out programming operation, erasing operation, and reading operation under a low temperature. The procedure from preburn-in test step 104 to low temperature test step 108 is included in a final test corresponding to a division test step in the present invention. In the final test, a plurality of flash memories are tested simultaneously in each group. A flash memory which cannot pass the final test is determined to be defective, and a flash memory which can pass the final test is determined to be non-defective. The flash memory to be determined to be non-defective is tested for reliability by a sampling inspection before shipment.

Figure 2:
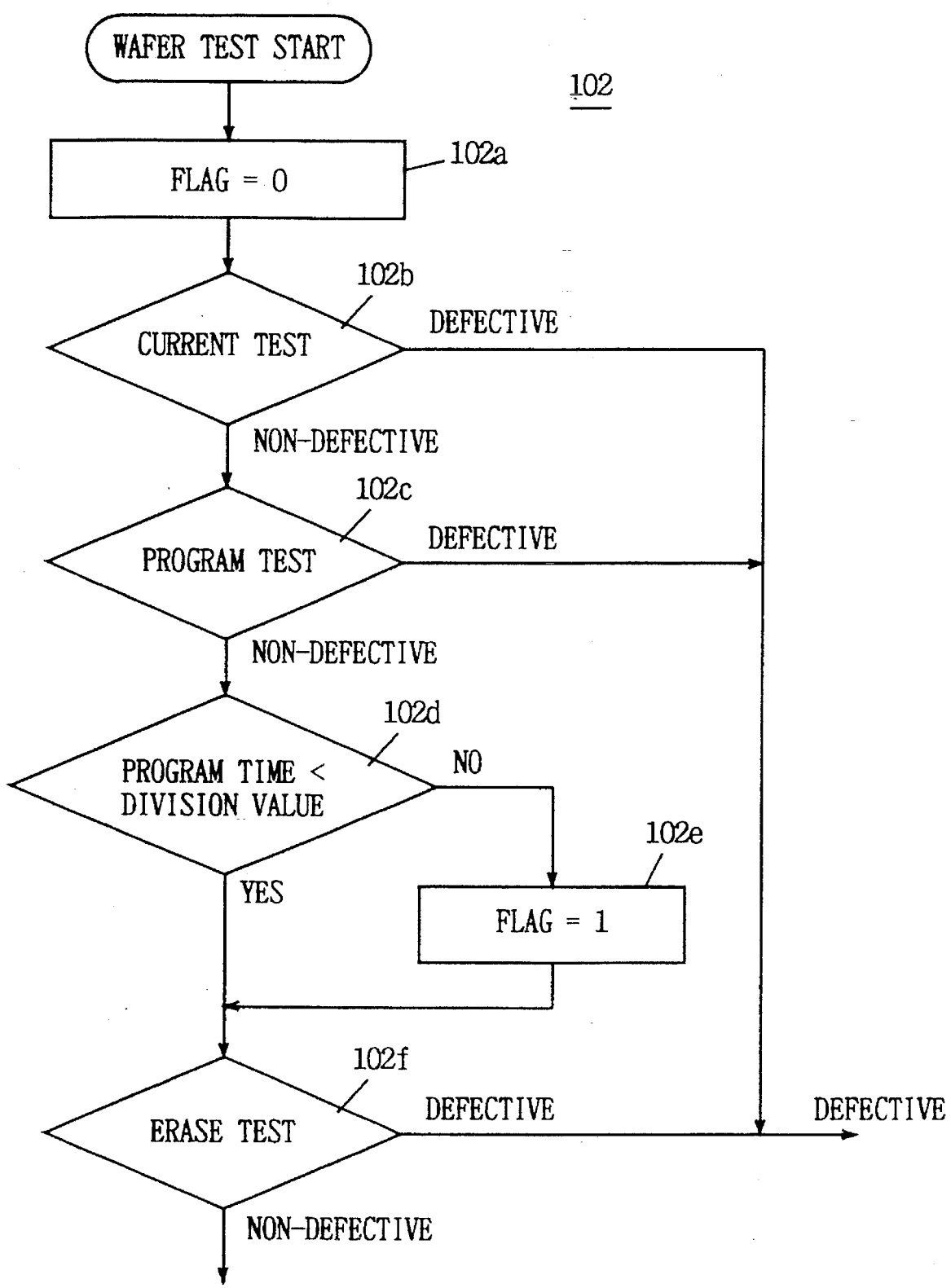
FIG. 2 is a flow chart showing a wafer test of Embodiment 1 of the present invention.

FIG. 2 is a flow chart of wafer step test 102 shown in FIG. 1. Referring to FIG. 2, in a flag program step 102a, flag memory cells formed on a chip are programmed. In this step 102a, the flag memory cells store "0". Programming, erasing, and reading of the flag memory cells can be carried out by setting the chip in a test mode state by input of a command not used at the time of normal operation, application of a potential to an address pad not within the range of potential applied during normal operation (for example, 10 V if 0 V–5 V is applied at the time of normal operation), provision of a pad not bonded to a pin at the time of assembly and application of power supply potential Vcc to this pad, or the like.

Figure 14:
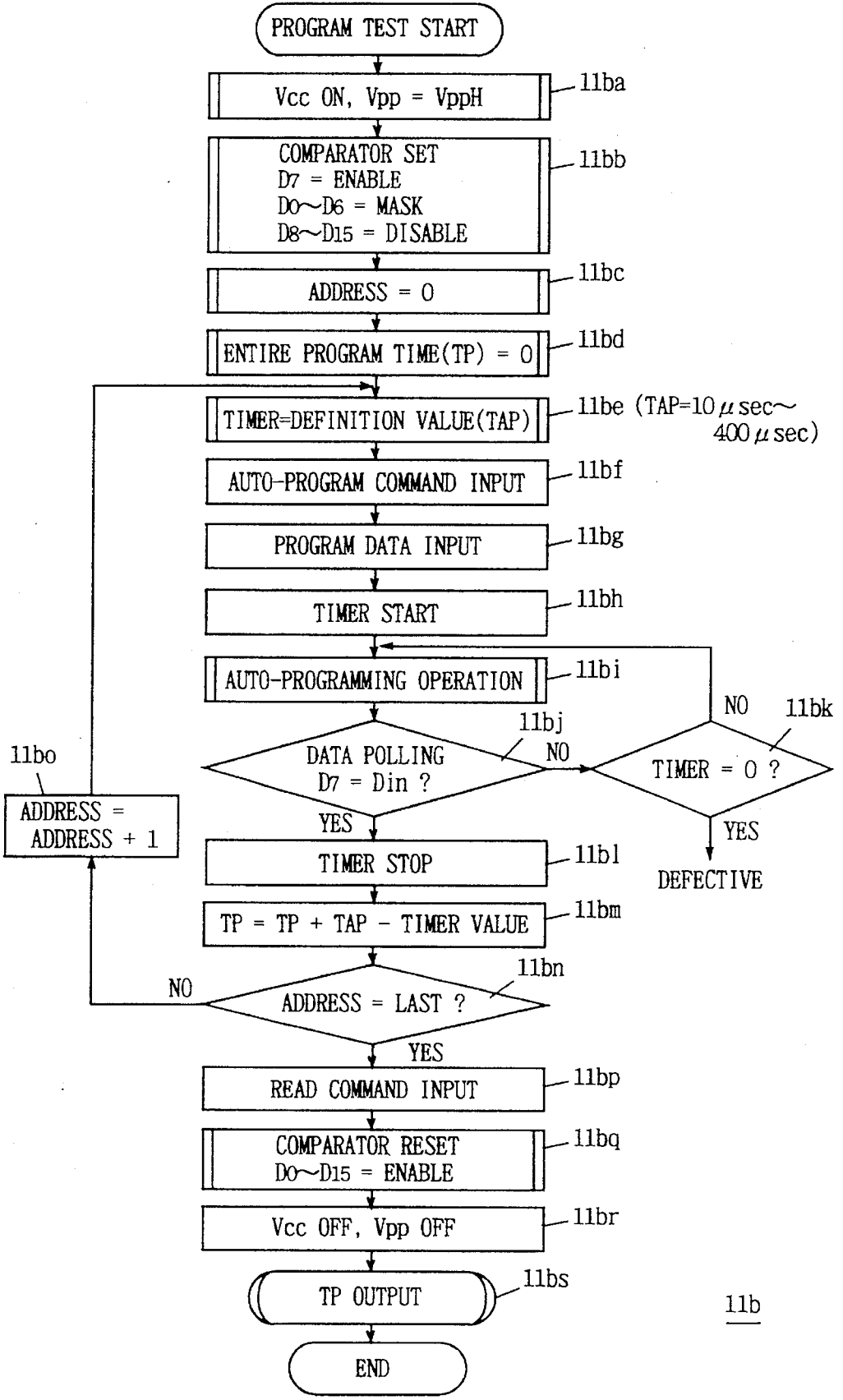
FIG. 14 is a flow chart showing a program test of the conventional flash memory.

A current test step 102b indicates a current test (DC test). In this step, current is caused to flow through the chip in order to determine whether or not the pad formed on the chip and an internal circuit are connected normally, whether or not there is a portion short-circuited in the internal circuit, or the like, similar to the conventional case. If the current value is not within the range of normal values, the chip is determined to be defective. In a program test step 102c, a memory cell is programmed using auto-programming operation, it is determined whether or not the memory cell is programmed within a defined time, and the chip is determined to be defective if the memory cell is not programmed. An algorithm of the program test is approximately the same as the algorithm shown in FIG. 14. However, in this Embodiment 1, a program time (definition value–timer value) of each address from 0 address to the last address is further stored in a register in a tester.

Figure 15:
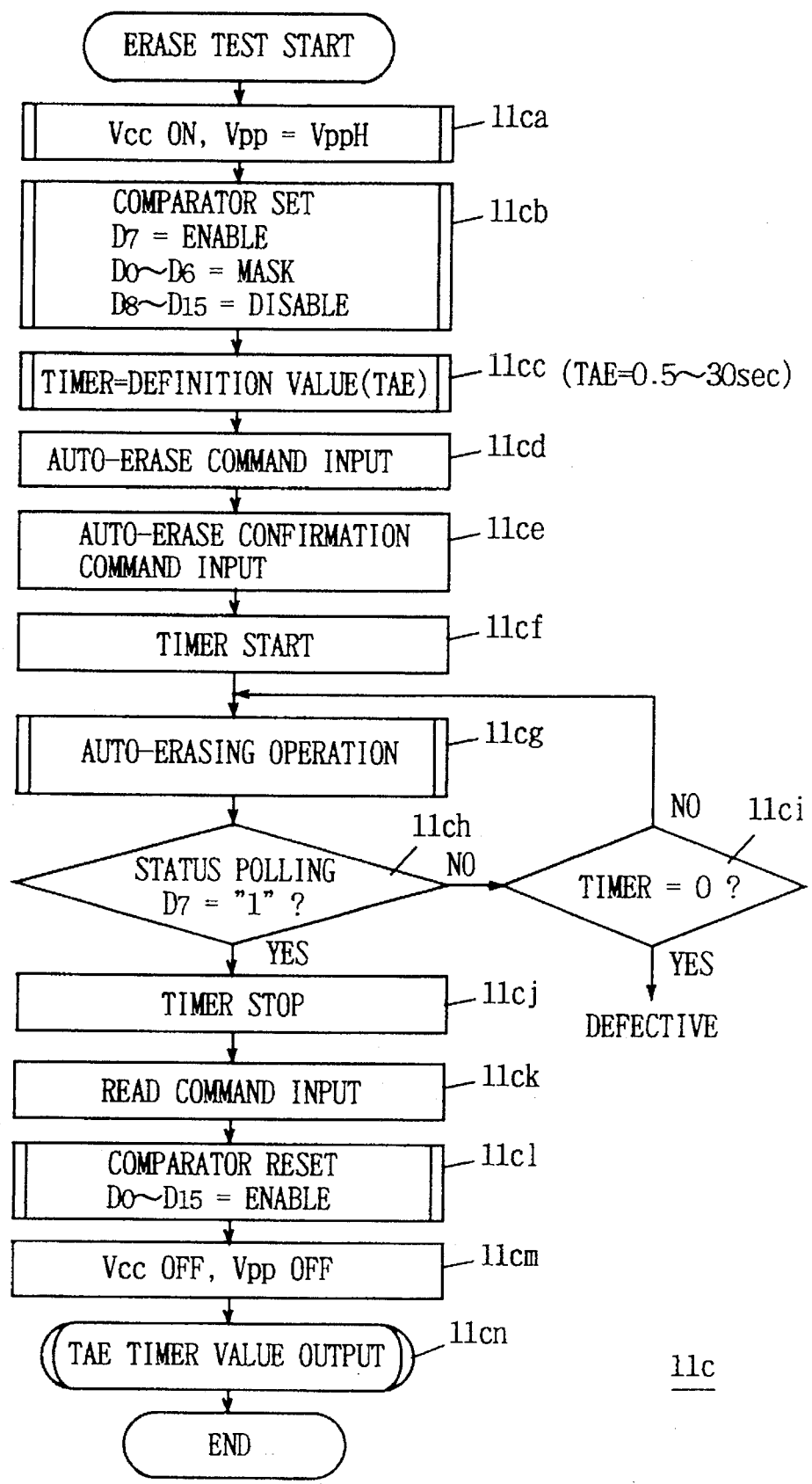
FIG. 15 is a flow chart showing an erase test of the conventional flash memory.
Figure 16:
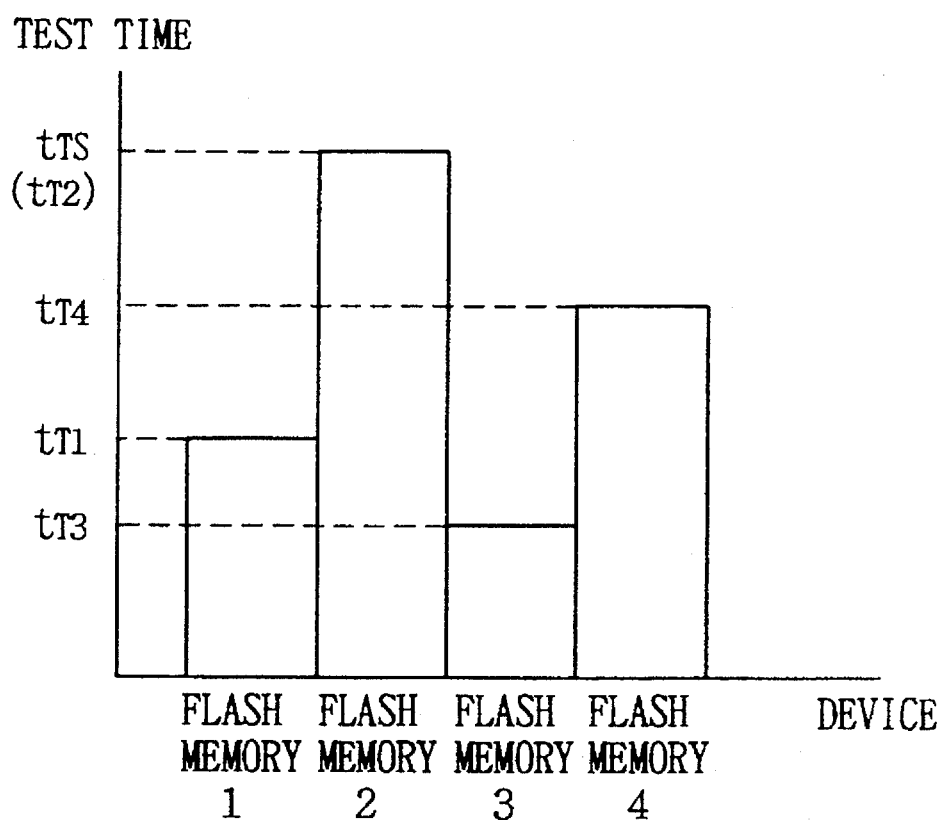
FIG. 16 is a graph showing the relationship between the devices and the test time in a parallel test of conventional flash memories.

In a comparison step 102d, a program time of each address from 0 address to the last address is compared with a group division value. If a program time of any address is equal to or larger than the division value, the flag memory cell is erased. The procedure goes to the next step 102f via a flag erase step 102e in which "1" is stored in the flag memory cell. If program times of all the addresses are smaller-than the group division value, the procedure directly goes to the next step 102f. In Embodiment 1, the group division value is set to ½ the definition value based on which the chip is determined to be defective. More specifically, if the program time in the program test is equal to or larger than this value, the chip is determined to be defective. In erase test step 102f, the memory cell is erased using auto-erasing operation, erasing within a defined time is checked, and the chip is determined to be defective if erasing is not carried out within the defined time. The erase test uses the same algorithm as that shown in FIG. 15.

As described above, in Embodiment 1, data of "0" or "1" is stored in the flag memory cells formed on each chip according to a time required for programming operation. Based on the data, chips are divided into a first group of chips requiring a shorter time for programming operation and a second group of chips requiring a time longer than the first group for the programming operation, and the final test involving the programing operation is carried out to a plurality of chips belonging to the first group simultaneously, and to a plurality of chips belonging to the second group simultaneously. Therefore, the final test in the first group is complete earlier than that in the second group, because the first group does not include the second group of chips requiring a longer time for the programming operation. According to this embodiment, the next plurality of chips can be tested in the first group without waiting for the test of the chips requiring a longer time for the programing operation to be complete, whereby a time to be consumed wastefully can be suppressed.

Further, by carrying out data writing (writing) to the flag memory cells for dividing flash memories into the first group and the second group at the time of wafer test involving the programming operation conducted before the final test, the program time can be measured during the programming operation. A time to be consumed by dividing flash memories into the first group and the second group can be suppressed, such as a time required for carrying out the programming operation just in order to measure the program time, whereby a test time to be consumed wastefully is further suppressed.

Further, it is expected that most of the chips belong to the first group according to the design value of the program time. Therefore, from the standpoint of suppression of time to be consumed by dividing flash memories into the first group and the second group, first programming flag memory cells to store "0" and then erasing only flag memory cells of flash memories determined to belong to the second group to store "1" is more preferable than first erasing flag memory cells to store "1" and then programing the flag memory cells to store "0", taking into consideration the fact that the erasing operation consumes more time than the programming operation. Accordingly, a test time to be consumed wastefully is further suppressed.

Data for group division is written in flag memory cells in the wafer test. Therefore, if flash memories are divided into groups at this time, and assembly is carried out for each group, preburn-in test step 104 and et seq. are carried out groupwise. A test time to be consumed wastefully can be further suppressed.

Data for group division is written in flag memory cells in the wafer test. Therefore, if a spare pad which is not bonded to the pin at the time of assembly is provided on a chip so that the chip can be set to a test mode in which flag memory cells can be accessed using the pad, the chip can be easily set to the test mode without application of a command not used at the time of normal operation, and data can be stored in the flag memory cells.

Further, each chip includes flag memory cells. Therefore, even if chips are cut away after the wafer test and separated from each other, the chips can be divided easily and immediately by reading out data of the flag memory cells of each chip.

Comparison is now made between a method of testing a flash memory in Embodiment 1 and a conventional method using specific numerical values, in order to demonstrate how much time is saved by this method. As a comparison model, consider the case where 1000 flash memories each having 1M bits (128 k bytes) and 8I/O (input/output on the one-byte basis) are tested, and where a parallel test in which four flash memories are tested simultaneously is employed in the final test. Assume that, when a program time of one byte is 400 μsec by the catalog value (value within which it is guaranteed that programming will be complete), the actual program time of a flash memory is 200 μsec in order to have a sufficient margin to the catalog value. Therefore, a definition value based on which the flash memory is determined to be defective is 200 μsec. More specifically, if the program time in program test step 102c is equal to or larger than this value, the flash memory is determined to be defective. A group division value based on which flash memories are divided into first and second groups is 100 μsec. A time required for programming all the memory cells of flash memories of the first group is 100 μsec/Byte×128 k Byte=13.11 sec, and a time required for programming all the memory cells of each flash memory in the second group is 200 μsec/Byte×128 k Byte=26.21 sec.

A design value is set smaller than the group division value. 95% of the flash memories each have a program time smaller than the group division value, and belong to the first group. The remaining 5% of the flash memories each have a program time equal to or larger than the group division value, and belong to the second group. More specifically, 950 flash memories out of 1000 belong to the first group, and the remaining 50 flash memories belong to the second group.

In the conventional test method, the number of tests required for testing 1000 flash memories is 250. Assume that 50 flash memories in the second group are randomly mixed, and that they are not tested simultaneously (this assumption is appropriate because the probability that two out of four belong to the second group is 1.35%). Since flash memories are not divided into groups in the conventional test method, it takes 26.21 sec to carry out programming operation in 50 tests out of 250. Therefore, a time required for programming is 200×13.11 sec+50×26.21 sec≈3933 sec.

In the test method of Embodiment 1, flash memories are divided into groups and tested. Tests are carried out 238 times in order to test 950 flash memories belonging to the first group. After that, 13 tests are carried out in order to test 50 flash memories belonging to the second group. A time required for programming is 238×13.11 sec +13×26.21 sec≈3461 sec. When flag memory cells of four flash memories are simultaneously programmed to store data "0" in the flag memory cells in flag program step 102a, the total time required for programming of the flag memory cells is 250×400 μsec=0.1 sec, even though the worst value of 400 μsec is required for programming.

Even if 30 sec of the catalog value is required as erase time for storing "1" in flag memory cells of 50 flash memories in the second group in flag erase step 102e, the total time required for erasing is 13×30 sec=390 sec. A time required for reading out data from flag memory cells in group division can be negligible, because it is smaller than the time required for programming, that is, 0.1 sec, by one digit or more. In Embodiment 1, programming is carried out three times in the postburn-in test, the high temperature test, and the low temperature test. Therefore, the test time is shortened by 3×(3933−3461)−0.1−390≈1026 sec≈17 min. Such shortened test time as described above contributes to reduction of test cost, which in turn reduces chip cost.

Embodiment 2

Figure 3:
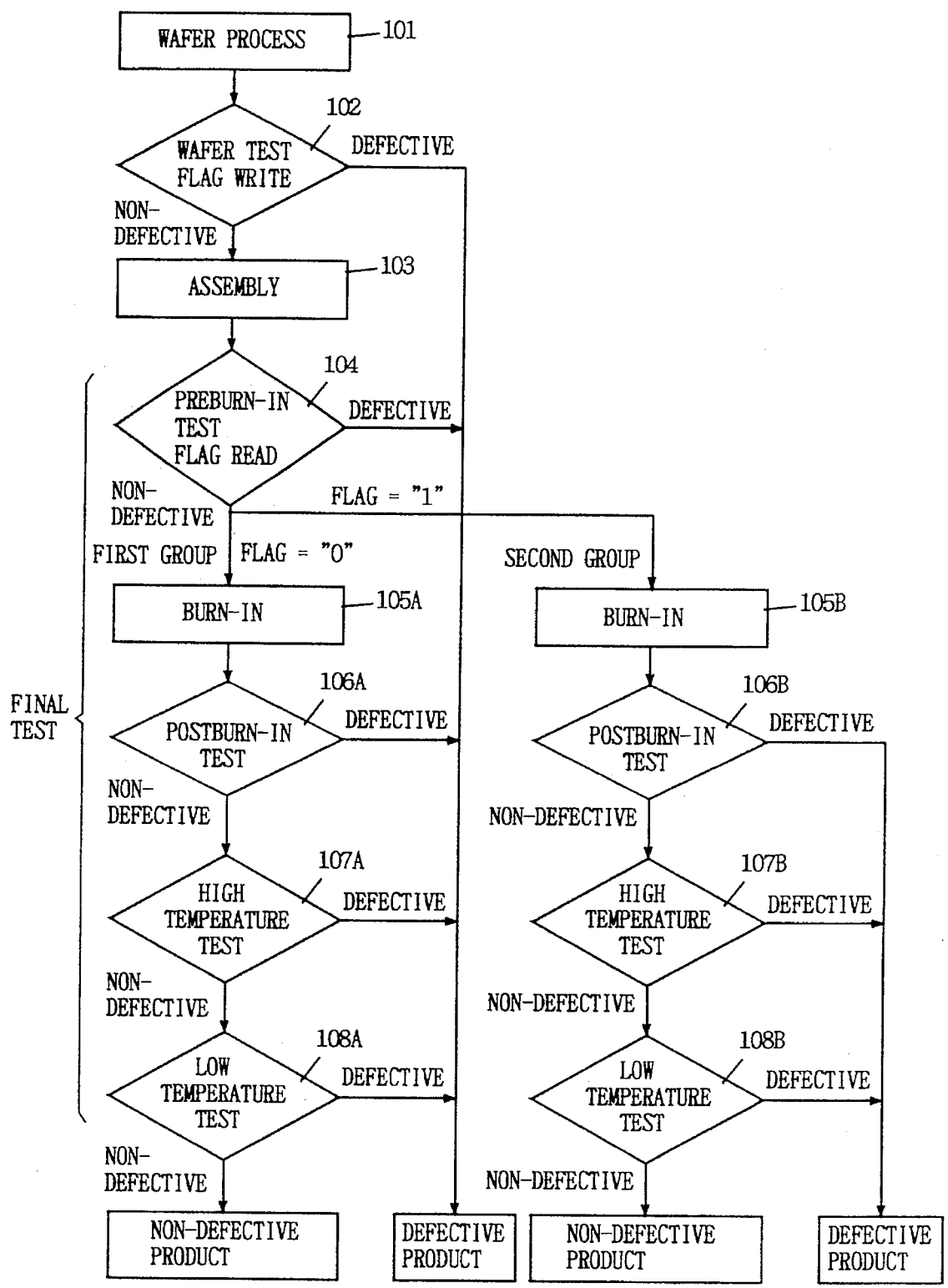
FIG. 3 is a flow chart showing an algorithm of a method of testing of Embodiment 2 of the present invention.

A method of testing a flash memory according to Embodiment 2 of the present invention will be described hereinafter with reference to flow charts of FIGS. 3 and 4. FIG. 3 shows a flow chart showing an algorithm of a test using auto-programming operation and auto-erasing operation. The algorithm shown in FIG. 3 is different from that of Embodiment 1 shown in FIG. 1 in the following point. In Embodiment 1, flag writing is carried out in which, by using a program time of each chip detected at the time of the program test in wafer test step 102, "0" is stored in flag memory cells formed on each chip if the program time is smaller than a group division value, and "1" is stored if the program time is equal to or larger than the group division value. On the other hand, in Embodiment 2, flag writing is carried out in which, by using an erase time of each chip detected at the time of the erase test in wafer test step 102, "0" is stored in flag memory cells formed on each chip if the erase time is smaller than the group division value, and "1" is stored in the flag memory cells if the erase time is equal to or larger than the group division value.

Figure 4:
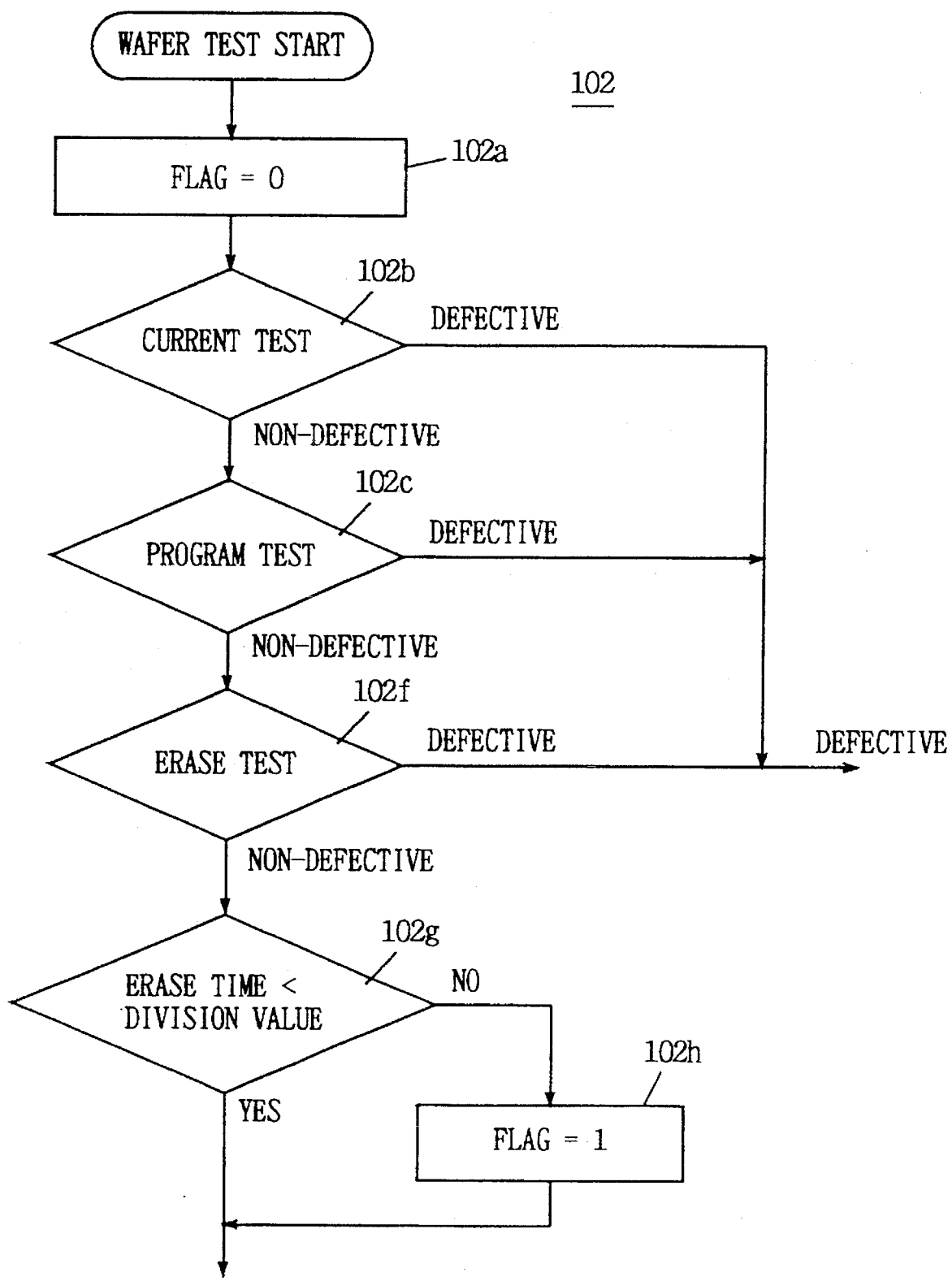
FIG. 4 is a flow chart showing a wafer test of Embodiment 2 of the present invention.

FIG. 4 shows a flow chart of wafer test step 102 of Embodiment 2 shown in FIG. 3. Referring to FIG. 4, in flag program step 102a, flag memory cells formed on a chip are programmed similar to Embodiment 1. In this step 102a, the flag memory cell stores "0". In current step test 102b, a current test (DC test) similar to that of Embodiment 1 is carried out. In program test step 102c, a memory cell is programmed using auto-programming operation, programming within a defined time is checked, and the chip is determined to be defective if programming is not carried out within the defined time. The program test uses the same algorithm as that shown in FIG. 14.

In erase test step 102f, erasing is carried out using auto-erasing operation, erasing within a defined time is checked, and the chip is determined to be defective if erasing is not carried out within the defined time. The erase test uses approximately the same algorithm as that shown in FIG. 15. However, in Embodiment 2, the erase time (definition value—timer value) is further stored in the register in the tester.

In comparison step 102g, the erase time is compared with a group division value. If the erase time is equal to or larger than the group division value, the procedure goes to the next step via a flag erase step 102h in which the flag memory cells are erased, and "1" is stored therein. If the erase time is smaller than the group division value, the procedure directly goes to the next step. In Embodiment 2, the group division value is set to ½ a definition value based on which the chip is determined to be defective. More specifically, the chip is determined to be defective if the erase time in the erase test is equal to or larger than this value.

As described above, in Embodiment 2, data of "0" or "1" is stored in the flag memory cells formed on each chip according to time required for the erasing operation. Based on the data, chips are divided into a first group of chips requiring a shorter time for the erasing operation and a second group of chips requiring a time longer than the first group for the erasing operation. The final test involving the erasing operation (tests from preburn-in test step 104 to low temperature test step 108) is carried out to a plurality of chips belonging to the first group simultaneously, and to a plurality of chips belonging to the second group simultaneously. Therefore, the final test in the first group is complete earlier than that in the second group, because the first group does not include the second group of chips requiring a longer time for the erasing operation. According to this embodiment, the next plurality of chips can be tested in the first group without waiting for the test of the chips requiring a longer time for the erasing operation to be complete, whereby a test time to be consumed wastefully can be suppressed.

By carrying out data writing (writing) to flag memory cells for dividing flash memories into the first group and the second group at the time of the wafer test involving the erasing operation conducted before the final test, the erase time can be measured during the erasing operation. A time to be consumed by dividing flash memories into the first group and the second group, such as a time required for carrying out the erasing operation just in order to measure the erase time, can be suppressed, whereby a test time to be consumed wastefully is further suppressed.

It can be expected that most chips belong to the first group according to a design value of the erase time. Therefore, from the standpoint of suppression of a time to be consumed by dividing flash memories into the first group and the second group, first programming flag memory cells to store "0" and then erasing only flag memory cells of flash memories determined to belong to the second group to store "1" is more preferable than first erasing flag memory cells to store "1" and then programming the flag memory cells to store "0", taking into consideration the fact that the erasing operation consumes more time than the programming operation. Accordingly, a test time to be consumed wastefully is further suppressed.

Similar to the case of Embodiment 1, data for group division is written in the flag memory cells in the wafer test. Therefore, if flash memories are divided into groups in the wafer test, and assembly is carried out for every group, preburn-in test step 104 can be carried out groupwise. A test time to be consumed wastefully can be further suppressed.

Similar to the case of Embodiment 1, data for group division is written in the flag memory cells in the wafer test. Therefore, if a spare pad not bonded to the pin at the time of assembly is provided on a chip so that the chip can be set to a test mode in which the flag memory cells can be accessed using this pad, the chip can be set to the test mode easily without input of a command not used during the normal operation.

In addition, similar to the case of Embodiment 1, each chip includes flag memory cells. Therefore, even if chips are cut away after the wafer test and separated from each other, they can be divided easily and immediately by reading out data of the flag memory cells of each chip.

Comparison will be made between the method of testing a flash memory according to Embodiment 2 and the conventional method using specific numerical values, in order to demonstrate how much time can be saved by this embodiment. First, as a comparison model, consider the case where the final test is conducted to four flash memories simultaneously, and 1000 flash memories in total are tested. Assume that, when the erase time is 30 sec by the catalog value (value within which it is guaranteed that erasing will be complete), the actual erase time of the flash memory is 15 sec in order to have a sufficient margin to the catalog value. Accordingly, a definition value based on which the flash memory is determined to be defective is 15 sec. More specifically, if the erase time in erase test step 102$f$ is equal to or larger than this value, the flash memory is determined to be defective. The group division value for dividing flash memories into the first group and the second group is 7.5 sec.

A design value is smaller than the group division value. 95% of flash memories each have an erase time smaller than the group division value, and belong to the first group. The remaining 5% of flash memories each have an erase time equal to or larger than the group division value, and belong to the second group. More specifically, 950 flash memories out of 1000 belong to the first group, and the remaining 50 flash memories belong to the second group.

First, in the conventional test method, the number of tests required for testing 1000 flash memories is 250. Assume that 50 flash memories of the second group are randomly mixed, and that they are not tested simultaneously. Since flash memories are not divided into groups in the conventional test, it takes 15 sec to carry out erasing operation in 50 tests out of 250. Therefore, a time required for erasing is 200×7.5 sec+50×15 sec=2250 sec.

In the test method of Embodiment 2, flash memories are divided into groups and tested. Tests are carried out 238 times in order to test 950 flash memories belonging to the first group. After that, 13 tests are carried out in order to test 50 flash memories belonging to the second group. Time required for erasing is 238×7.5 sec+13×15 sec=1980 sec. If flag memory cells of four flash memories are simultaneously programmed in order to store data "0" in the flag memory cells in flag program step 102$a$, the total time required for programming of the flag memory cells is 250×400 μsec=0.1 sec, even if 400 μsec of the catalog value is required for programming. If 30 sec of the catalog value is required as the erase time to store "1" in flag memory cells of 50 flash memories of the second group, the total time required for erasing is 13×30 sec=390 sec. In Embodiment 2, erasing is carried out three times in the postburn-in test, the high temperature test, and the low temperature test. Therefore, the test time is shortened by 3×(2250−1980)−0.1−390≈420 sec=7 min. Such shortened test time contributes to reduction of test cost, which in turn reduces chip cost.

Embodiment 3

Figure 5:
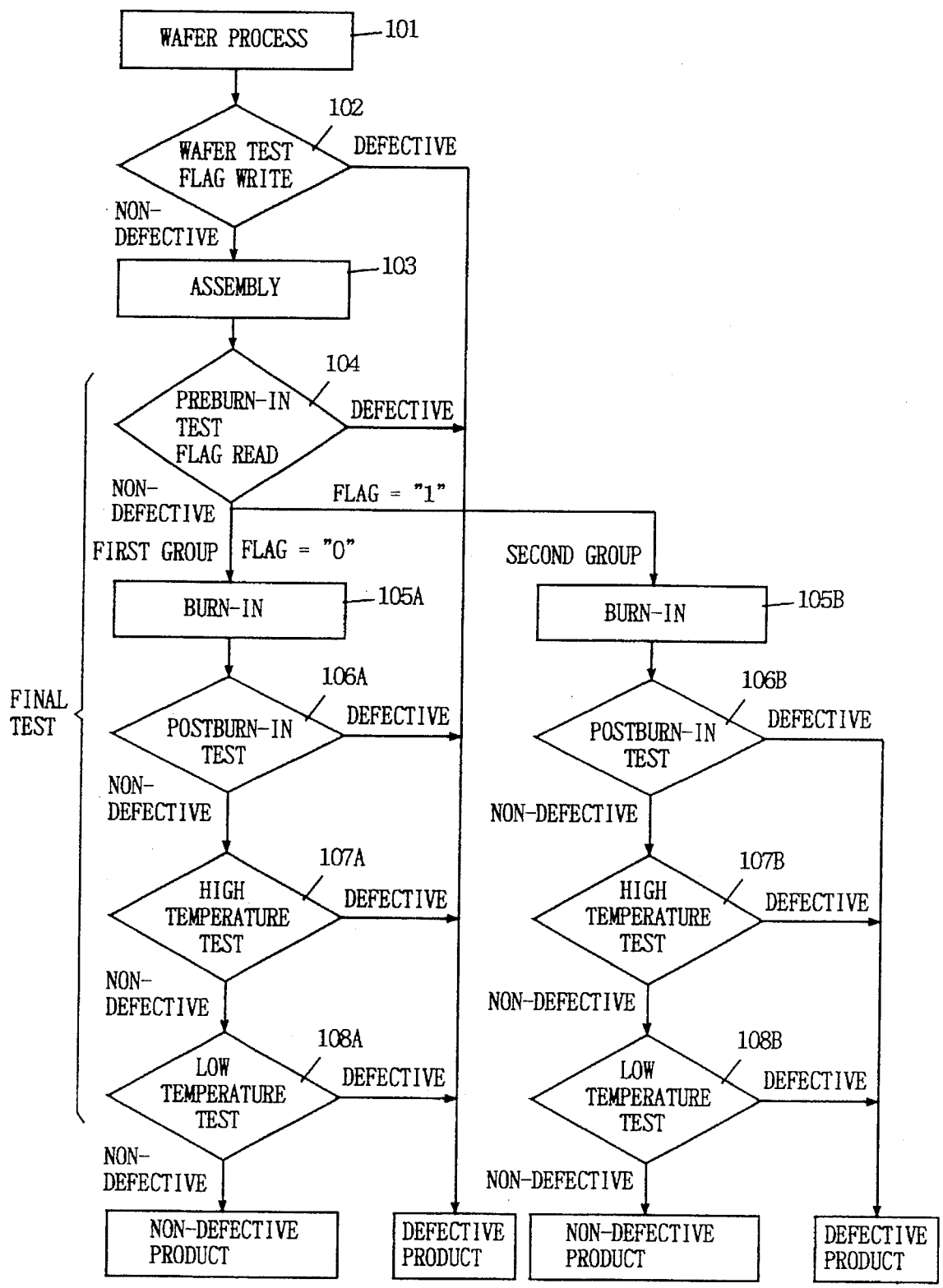
FIG. 5 is a flow chart showing an algorithm of a method of testing of Embodiment 3 of the present invention.

A method of testing a flash memory according to Embodiment 3 of the present invention will be described hereinafter with reference to flow charts of FIGS. 5 and 6. FIG. 5 shows a flow chart showing an algorithm of a test using auto-programing operation and auto-erasing operation. The algorithm shown in FIG. 5 is different from that of Embodiment 1 shown in FIG. 1 in the following point. More specifically, in Embodiment 1, flag writing is carried out in which, by using a program time of each chip detected at the time of the program test in wafer test step 102, "0" is stored in flag memory cells formed on each chip if the program time is smaller than a group division value, and "1" is stored if the program time is larger than the group division value. On the other hand, in Embodiment 3, flag writing is carried out in which, by using a program time of each chip detected at the time of the program test and an erase time of each chip detected at the time of the erase test in wafer test step 102, "0" is stored in the flag memory cells formed on each chip if the program time is smaller than a first group division value, and if the erase time is smaller than a second group division value, and "1" is stored if the program time is equal to or larger than the first group division value, or if the erase time is equal to or larger than the second group division value.

Figure 6:
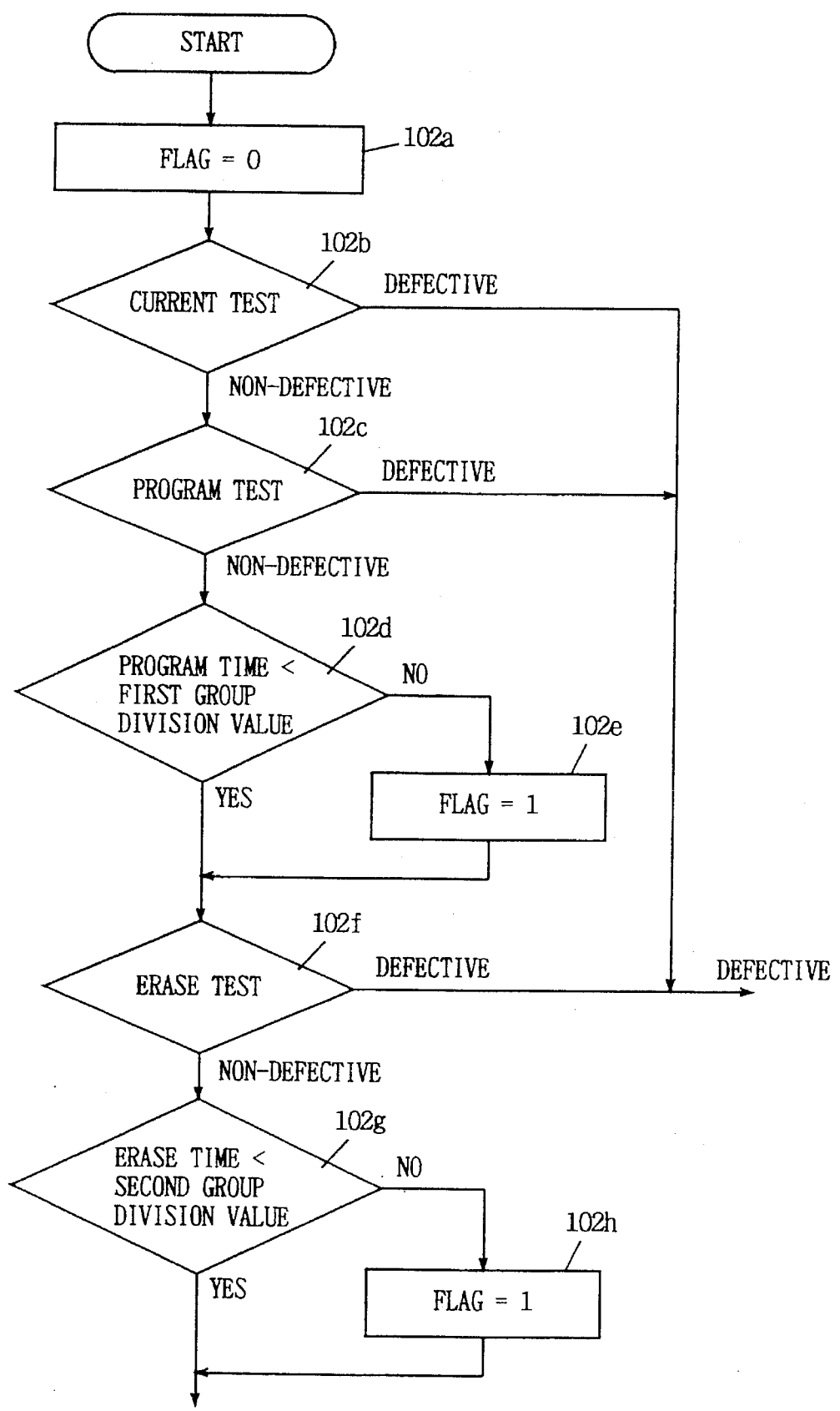
FIG. 6 is a flow chart showing a wafer test of Embodiment 3 of the present invention.

FIG. 6 is a flow chart of wafer test step 102 of Embodiment 3 shown in FIG. 5. Referring to FIG. 6, in flag program step 102$a$, flag memory cells formed on each chip are programmed similar to the case of Embodiment 1. In current test step 102$b$, a current test (DC test) similar to that of Embodiment 1 is carried out. Also in program test step 102$c$, a program test similar to that of Embodiment 1 is carried out. In first comparison step 102$d$, the program time and the first group division value are compared similar to the case in comparison step 102*d* of Embodiment 1. Flag erase step 102*e* is also similar to the case of Embodiment 1. Erase test step 102*f* is similar to the case of Embodiment 2. In second comparison step 102*g*, the erase time and the second group division value are compared, similar to the case of comparison step 102*g* of Embodiment 2. Flag write step 102*h* is similar to the flag write step of Embodiment 2. In embodiment 3, the first group division value is set to ½ a definition value based on which a flash memory is determined to be defective. More specifically, the flash memory is determined to be defective if the program time in the program test is equal to or larger than this value. The second group division value is set to ½ a definition value based on which a flash memory is determined to be defective. More specifically, the flash memory is determined to be defective if the erase time in the erase test is equal to or larger than this value.

As described above, in Embodiment 3, data of "0" or "1" is stored in flag memory cells formed on each chip according to time required for the programming operation and the erasing operation. Based on the data, chips are divided into a first group of chips requiring a shorter time both for the programming operation and for the erasing operation and a second group of chips requiring a time longer than the first group for the programming operation or for the erasing operation, and the final test (tests from preburn-in test step 104 to low temperature test step 108) involving the programing operation and the erasing operation is carried out to a plurality of chips belonging to the first group simultaneously, and to a plurality of chips belonging to the second group. Therefore, the final test in the first group is complete earlier than that in the second group, because the first group does not include the second group of chips requiring a longer time for the programing operation or for the erasing operation. According to this embodiment, the next plurality of chips can be tested in the first group without waiting for the test of the chips requiring a longer time for the programing operation or for the erasing operation to be complete, whereby a time to be consumed wastefully can be suppressed.

By carrying out data writing (writing) to the flag memory cells for dividing flash memories into the first group and the second group at the time of the wafer test involving the programing operation and the erasing operation conducted before the final test, the program time and the erase time can be measured during the programing operation and the erasing operation. A time consumed by dividing flash memories into the first group and the second group, such as a time required for carrying out the programming operation and the erasing operation just in order to measure the program time and the erase time, can be suppressed, whereby a test time to be consumed wastefully is further suppressed.

In this embodiment, it can be expected that most chips belong to the first group according to design values of the program time and the erase time. Therefore, from the standpoint of suppression of time consumed by dividing chips into the first group and the second group, first programming flag memory cells to store "0" and then erasing only flag memory cells of flash memories determined to belong to the second group to store "1" is more preferable than first erasing flag memory cells to store "1" and then programming the flag memory cells to store "0", taking into consideration the fact that the erasing operation consumes more time than the programming operation. A test time to be wasted is further suppressed.

Similar to Embodiment 1, data for group division is written in the flag memory cells in the wafer test. Therefore, if chips are divided into groups in the wafer test, and assembly is carried out for every group, preburn-in test step 104 can be carried out groupwise. A test time to be consumed wastefully can be further suppressed.

Similar to Embodiment 1, data for group division is written in the flag memory cells in the wafer test. Therefore, if a spare pad not bonded to a pin at the time of assembly is provided on a chip so that the chip can be set to a test mode where the flag memory cells can be accessed using this pad, the chip can be set to the test mode easily without input of a command not used during the normal operation.

Further, similar to Embodiment 1, each chip includes flag memory cells. Therefore, even if chips are cut away after the wafer test and separated from each other, they can be divided easily and immediately by reading out data of the flag memory cells of each chip.

Comparison is made between the method of testing a flash memory according to Embodiment 3 and the conventional test using specific numerical values, in order to demonstrate how much time is saved by this embodiment. First, as a comparison model, 1000 flash memories each having 1M bits (128 k bytes) and 8I/O (input/output on the one-byte basis) are tested, and a parallel test in which four flash memories are tested simultaneously is employed in the final test. Similar to the case of Embodiment 1, when the program time of one byte is 400 μsec by the catalog value (value within which it is guaranteed that programming will be complete), the actual program time of the flash memory is set to 200 μsec in order to have a sufficient margin to the catalog value. A definition value based on which the flash memory is determined to be defective is 200 μsec. More specifically, the flash memory is determined to be defective if the program time in program test 102*c* is equal to or larger than the definition value. A first group division value based on which chips are divided into the first group and the second group is 100 μsec.

Similar to the case of Embodiment 2, when the erase time is 30 sec by the catalog value (value within which it is guaranteed that erasing will be complete), the actual erase time of a flash memory is set to 15 sec in order to have a sufficient margin to the catalog value. Accordingly, a definition value based on which a flash memory is determined to be defective is 15 sec. More specifically, a flash memory is determined to be defective if the erase time in erase test 102*f* is equal to or larger than the definition value. A second group division value for dividing flash memories into the first group and the second group is 7.5 sec. A time required for programming all the memory cells of each flash memory of the first group is 100 μsec/Byte×128 k Byte=13.11 sec, and a time required for programming all the memory cells of each flash memory of the second group is 200 μsec/Byte× 128 k Byte=26.21 sec.

Assume that a design value is made smaller than the first and second group division values. Assume that 95% of the flash memories each have a program time smaller than the first group division value, and an erase time smaller than the second group division value, and belong to the first group. Assume that the remaining 5% of the flash memories each have a program time equal to or larger than the first group division value, or an erase time equal to or larger than the second group division value, and belong to the second group. More specifically, 950 flash memories out of 1000 belong to the first group, and the remaining 50 flash memories belong to the second group.

As seen in the specific comparison between Embodiment 1 and the conventional test method, the total time required for programming is 200×13.11 sec+50×26.21 sec≈3933 sec in the conventional test method. As seen in the specific comparison between Embodiment 2 and the conventional test method, the total time required for erasing is 200×7.5 sec+50×15 sec=2250 sec. On the other hand, in the test method of Embodiment 3, the total time required for programing is 238×13.11 sec+13×26.21 sec≈3461 sec similar to the case of Embodiment 1, and the total time required for erasing is 238×7.5 sec+13×15 sec=1980 sec, similar to the case of Embodiment 2.

Similar to Embodiments 1 and 2, 0.1 sec is required for programming of the flag memory cells in flag program step 102a, 390 sec is required for erasing of the flag memory cells in the flag erase step, and a flag read time for group division can be negligible because it is smaller than 0.1 sec required for programming. In Embodiment 3, programming and erasing are carried out three times in the postburn-in test, the high temperature test, and the low temperature test, the test time is shortened by 3×(3933−3461+2250−1980)−0.1−390≈1836 sec≈30 min. Such shortened test time contributes to reduction of test cost, which in turn reduces chip cost.

Embodiment 4

Figure 7:
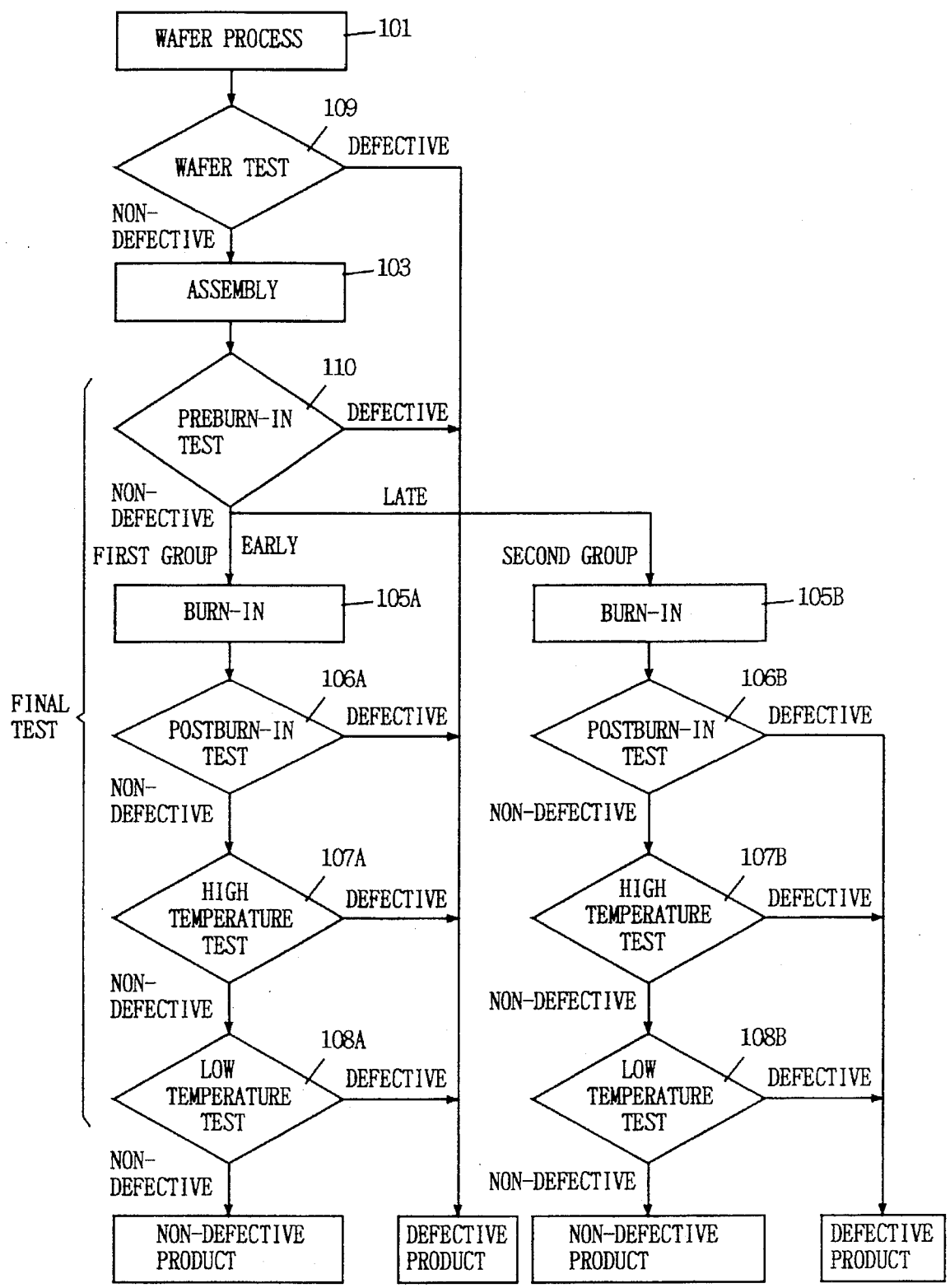
FIG. 7 is a flow chart showing an algorithm of a method of testing of Embodiment 4 of the present invention.
Figure 8:
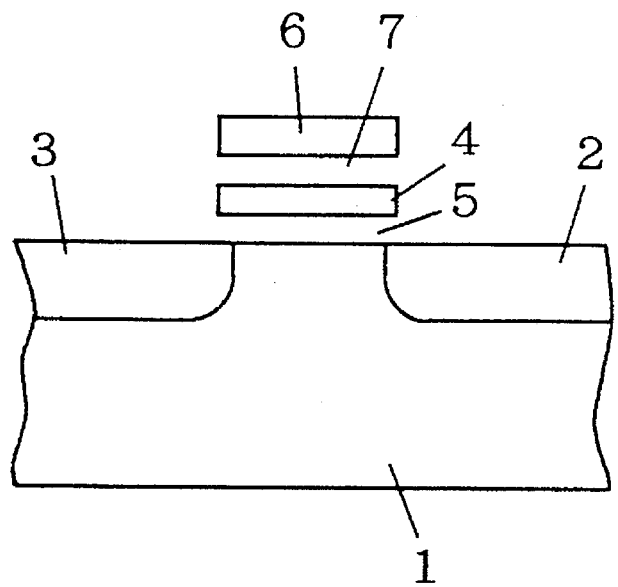
FIG. 8 is a sectional view of a memory cell of a conventional flash memory.
Figure 9:
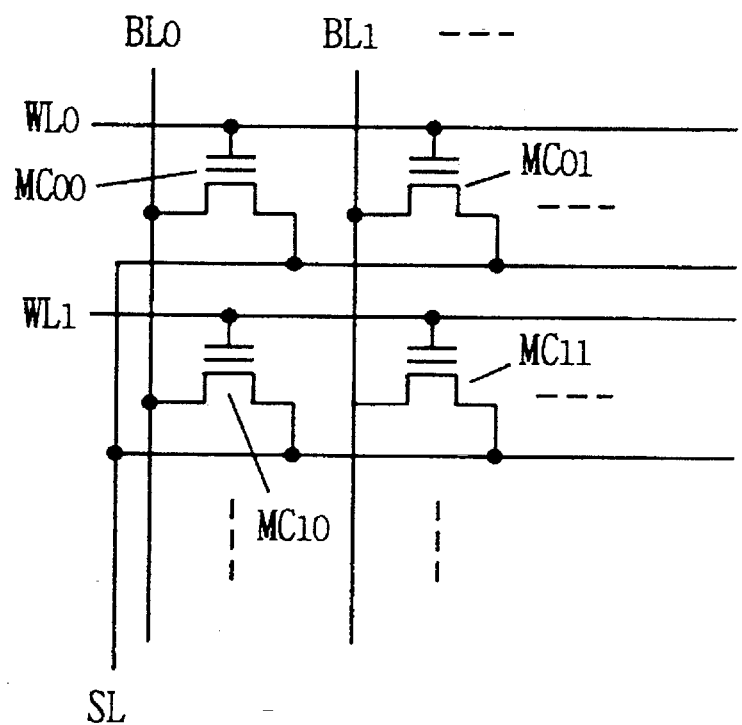
FIG. 9 is a diagram showing a circuit configuration of a memory cell array of the conventional flash memory.
Figure 10:
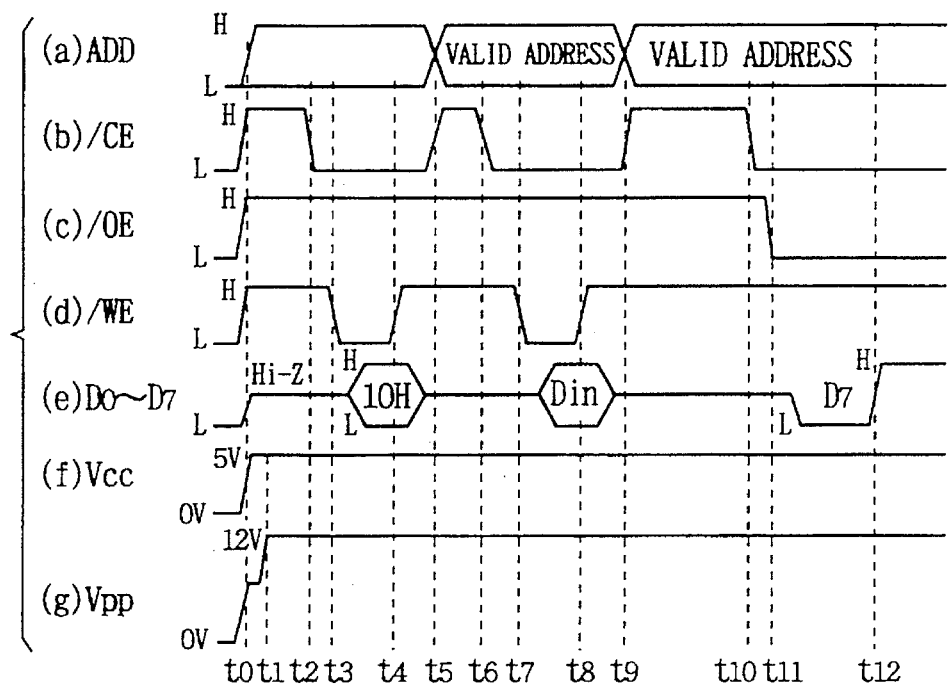
FIG. 10 is a timing chart showing auto-programming operation of the conventional flash memory.
Figure 11:
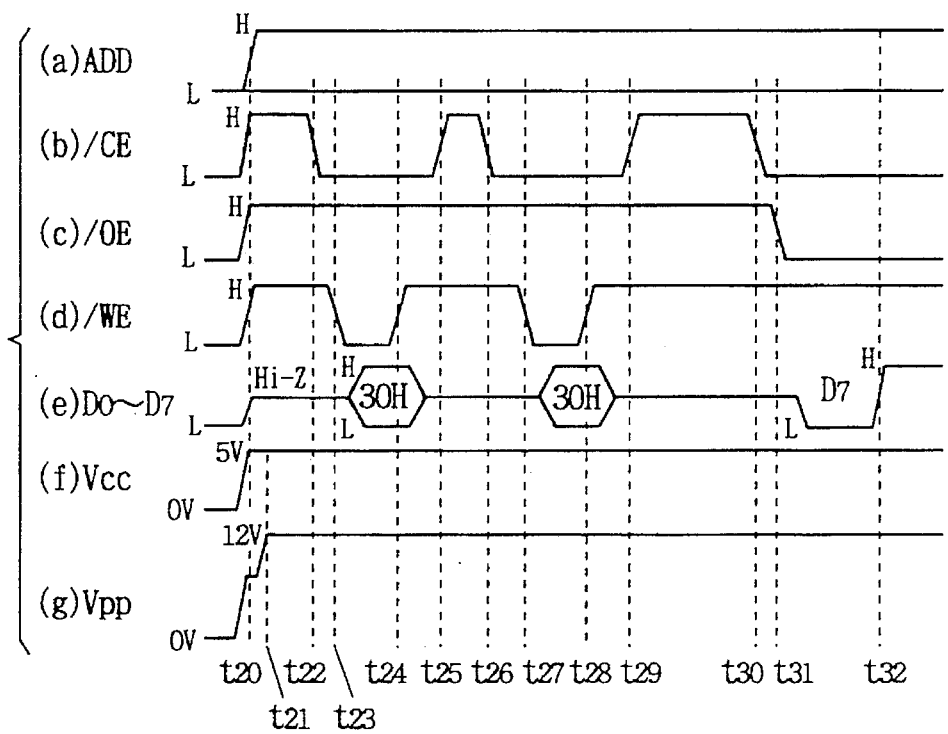
FIG. 11 is a timing chart showing auto-erasing operation of the conventional flash memory.
Figure 12:
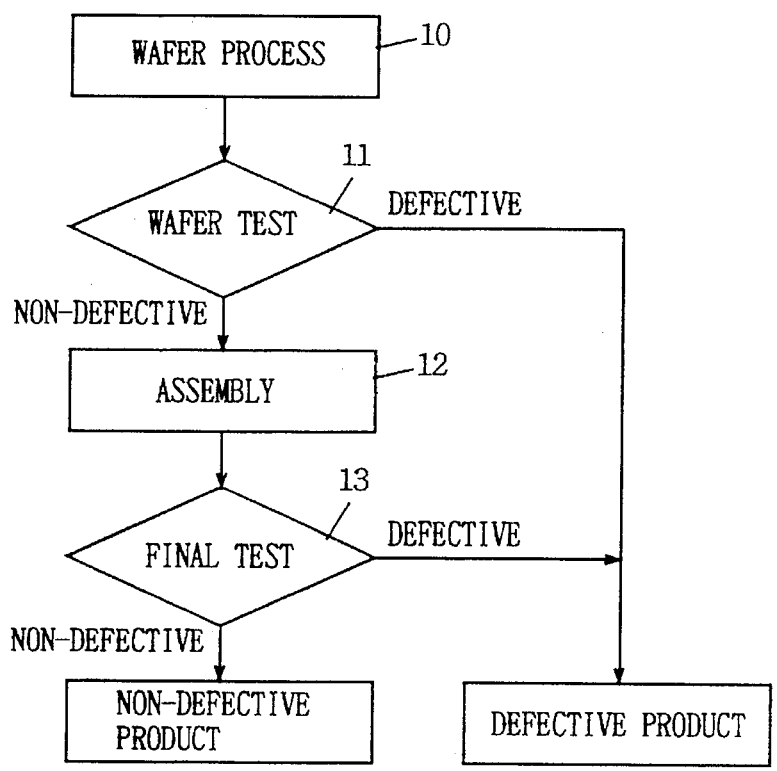
FIG. 12 is a flow chart showing an algorithm of a method of testing the conventional flash memory.
Figure 13:
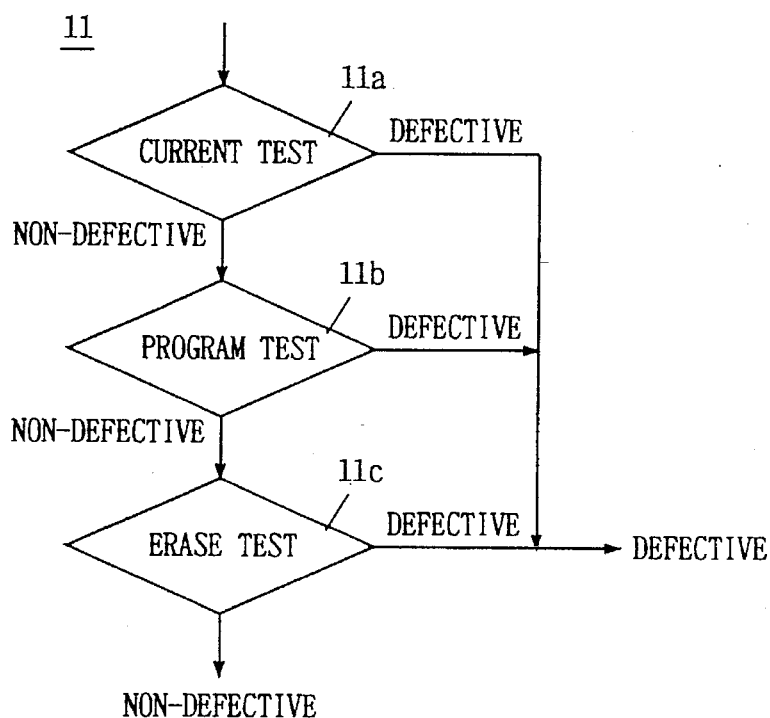
FIG. 13 is a flow chart showing a wafer test of the conventional flash memory.

A method of testing a flash memory according to Embodiment 4 of the present invention will be described hereinafter with reference to a flow chart of FIG. 7. FIG. 7 is a flow chart showing an algorithm of a test using auto-programming operation and auto-erasing operation. The algorithm shown in FIG. 7 is different from that of Embodiment 1 shown in FIG. 1 in the following point. More specifically, in Embodiment 1, flag writing is carried out in which, by using a program time of each chip detected at the time of the program test in wafer test step 102, "0" is stored in flag memory cells formed on each chip if the program time is smaller than a group division value, and "1" is stored if the program time is larger than the group division value. In preburn-in test step 104, data of the flag memory cells is read out, and based on the data, chips are divided into first and second groups. On the other hand, in Embodiment 3, flag memory cells are not formed on each chip, and chips are not divided into groups using the flag memory cells. Therefore, not flag writing as in Embodiment 1 but the same wafer test as the conventional one is carried out in wafer test step 109 shown in FIG. 7.

As to division of chips into the first and second groups, the programming operation carried out at the time of the preburn-in test is used. If the program time required at this time is smaller than a group division value, the chip is classified into the first group, and if the program time is equal to or larger than the group division value, the chip is classified into the second group. The steps after division of chips into the first and second groups are similar to those of Embodiment 1.

As described above, in Embodiment 4, similar to Embodiment 1, chips are divided into the first group of chips requiring a shorter time for the programing operation and the second group of chips requiring a time longer than the first group for the programing operation, and the final test involving the programming operation (from preburn-in test step 110 to low temperature test step 108) is carried out to a plurality of chips belonging to the first group simultaneously, and to a plurality of chips belonging to the second group simultaneously. Therefore, the final test in the first group is complete earlier than that in the second group, because the first group does not include the second group of chips requiring a longer time for the programming operation or the erasing operation. According to this embodiment, the next plurality of chips can be tested in the first group without waiting for the test of the chips requiring a longer time for the programming operation or for the erasing operation to be complete, whereby a time to be consumed wastefully can be suppressed.

Further, by carrying out division of flash memories into the first and second groups at the time of the preburn-in test involving the programming operation, the program time can be measured during the programming operation. A time consumed by division of flash memories into the first and second groups, such as a time required for carrying out the programming operation just in order to measure the program time, can be suppressed, whereby a test time to be consumed wastefully is further suppressed.

In Embodiment 4, flash memories are divided into the first and second groups according to a time required for the programming operation. However, flash memories may be divided according to a time required for the erasing operation. Alternatively, flash memories may be divided into groups according to both a time required for the programming operation and a time required for the erasing operation, as in the case of Embodiment 3. Even if flash memories are divided in this way, approximately the same effects can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of testing flash memory chips, comprising the steps of:

dividing said flash memory chips, according to a time required for programing operation, into a first group of chips and a second group of chips requiring a time longer than said first group of chips for said programming operation; and carrying out a test involving said programing operation to said first group of chips simultaneously, and to said second group of chips simultaneously.

2. A method of testing flash memory chips, comprising the steps of:

carrying out a first test involving programing operation to each of said flash memory chips, and storing data corresponding to a time required for the programing operation in flag memory cells formed on each chip;

dividing said flash memory chips into a first group of chips and a second group of chips requiring a time longer than said first group of chips for the programing operation based on said data stored in the flag memory cells formed on each chip; and carrying out a second test involving said programing operation to said first group of chips simultaneously, and to said second group of chips simultaneously.

3. The method of testing flash memory chips, according to claim 2, wherein said step of carrying out the first test and storing said data is carried out in a state where a plurality of chips are formed on a wafer, and said step of carrying out the second test is carried out after each chip is molded to a package.

4. A method of testing flash memory chips, comprising the steps of:

dividing said flash memory chips, according to a time required for erasing operation, into a first group of chips and a second group of chips requiring a time longer than said first group of chips for the erasing operation; and carrying out a test involving the erasing operation to said first group of chips simultaneously, and to said second group of chips simultaneously.

5. A method of testing flash memory chips, comprising the steps of:

carrying out a first test involving erasing operation to each of said flash memory chips, and storing data corresponding to a time required for the erasing operation in flag memory cells formed on each chip;

dividing said flash memory chips into a first group of chips and a second group of chips requiring a time longer than said first group of chips for the erasing operation based on said data stored in the flag memory cells formed on said each chip; and carrying out a second test involving the erasing operation to said first group of chips simultaneously, and to said second group of chips simultaneously.

6. The method of testing flash memory chips, according to claim 5, wherein said step of carrying out the first test and storing said data is carried out in a state where a plurality of chips are formed on a wafer, and said step of carrying out the second test is carried out after each chip is molded to a package.

7. A method of testing flash memory chips, comprising the steps of:

dividing said flash memory chips, according to a time required for programming operation and a time required for erasing operation, into a first group of chips and a second group of chips requiring a time longer than said first group of chips for the programming operation or for the erasing operation; and carrying out a test involving the programming operation and the erasing operation to said first group of chips simultaneously, and to said second group of chips simultaneously.

8. A method of testing flash memory chips, comprising the steps of:

carrying out a first test involving programing operation and erasing operation to each of said flash memory chips, and storing data corresponding to a time required for the programming operation and a time required for the erasing operation in flag memory cells formed on each chip;

dividing said flash memory chips, according to said data stored in the flag memory cells formed on said each chip, into a first group of chips and a second group of chips requiring a time longer than said first group of chips for the programming operation or for the erasing operation; and carrying out a second test involving the programming operation and the erasing operation to said first group of chips simultaneously, and to said second group of chips simultaneously.

9. The method of testing flash memory chips, according to claim 8, wherein said step of carrying out the first test and storing said data is carried out in a state where a plurality of chips are formed on a wafer, and said step of carrying out the second test is carried out after each chip is molded to a package.

* * * * *